United States Patent
Govindarajan et al.

(10) Patent No.: US 10,026,855 B2
(45) Date of Patent: Jul. 17, 2018

(54) PROCESS FOR MAKING POWDER ALLOYS CONTAINING CADMIUM AND SELENIUM

(71) Applicant: First Solar, Inc., Perrysburg, OH (US)

(72) Inventors: Shrinivas Govindarajan, Perrysburg, OH (US); Michael Latusek, Perrysburg, OH (US); Feng Yan, Perrysburg, OH (US)

(73) Assignee: FIRST SOLAR, INC., Perrysburg, OH (US)

( * ) Notice: Subject to any disclaimer, the term of this patent is extended or adjusted under 35 U.S.C. 154(b) by 183 days.

(21) Appl. No.: 15/046,887

(22) Filed: Feb. 18, 2016

(65) Prior Publication Data
US 2017/0133522 A1    May 11, 2017

Related U.S. Application Data

(60) Provisional application No. 62/118,683, filed on Feb. 20, 2015.

(51) Int. Cl.
*C01B 19/00* (2006.01)
*H01L 31/00* (2006.01)
*H01L 31/0296* (2006.01)

(52) U.S. Cl.
CPC ........ *H01L 31/0296* (2013.01); *C01B 19/002* (2013.01); *C01B 19/007* (2013.01)

(58) Field of Classification Search
CPC .. H01L 31/0296; C01B 19/002; C01B 19/007
USPC ........................................................ 252/500
See application file for complete search history.

(56) References Cited

U.S. PATENT DOCUMENTS

| | | | |
|---|---|---|---|
| 4,732,556 | A | 3/1988 | Chiang et al. |
| 4,990,180 | A | 2/1991 | Halverson et al. |
| 7,829,059 | B2 | 11/2010 | Guo et al. |
| 2006/0239882 | A1 | 10/2006 | Seo et al. |

(Continued)

FOREIGN PATENT DOCUMENTS

| CN | 102070129 A | 5/2011 |
|---|---|---|
| JP | S6081008 A | 5/1985 |
| SU | 1670001 | 8/1991 |

OTHER PUBLICATIONS

Bowen et al., "Selfpropagating high temperature synthesis of ceramic materials" British Ceramic Transactions, 1997, vol. 96, No. 1, pp. 25-31.

(Continued)

*Primary Examiner* — Harold Pyon
*Assistant Examiner* — Danny N Kang
(74) *Attorney, Agent, or Firm* — MacMillan, Sobanski & Todd, LLC

(57) ABSTRACT

A process for preparing alloy products powders is described using a self-sustaining or self-propagating SHS-type combustion process. Binary, ternary and quaternary alloy having cadmium, selenium and optionally a third element X or Y selected from Group VIA (such as S or Te) or from group IIB (such as Zn or Hg). The alloy products may be doped or not with a wide variety of other elements. The process involves heating to ignition, maintaining an elevated temperature less than melting for homogenization, followed by cooling and crushing. An optional de-oxidation process may follow to further purify the alloy and balance the stoichiometry.

21 Claims, 1 Drawing Sheet

(56) References Cited

U.S. PATENT DOCUMENTS

2008/0112878 A1* 5/2008 Kardokus ............... B22F 9/04
423/509
2016/0059313 A1* 3/2016 Tang .................... B22F 9/16
419/33

OTHER PUBLICATIONS

Carmalt et al., "Solid-state and solution phase metathetical synthesis of copper indium chalcogenides", Journal of Materials Chemistry, 1998, vol. 8, No. 10, pp. 2209-2211, Abstract only.

First SolarWiki, "Synthesis of doped CdSe ternary/quaternary alloys", Accessed Aug. 8, 2014 www.dolcer.com/client/ftsr/wiki/index.php/Synthesis_of_doped_CdSe_ternary_/_quaternary_alloys.

Kolesnikov et al., "HPVB and HPVZM shaped growth of CdZnTe, CdSe and ZnSe crystals", Institute of Solid State Physics, pp. 1-12.

Liu et al., "Hydrazine route to one-dimensional structural metal selenides crystals", 2004, vol. 261, No. 4, pp. 508-513, Abstract only.

Makino, "Fundamental aspects of the heterogeneous flame in the self-propagating high-temperature synthesis (SHS) process", Progress in Energy and Combustion Science, 2001, vol. 27, No. 1, pp. 1-74, Abstract only.

Martinez Pacheco, "Self-sustained High-temperature Reactions: Initiation, propagation and synthesis", Ingeniera Industrial, Universidad Carlos III de Madrid, 2007, pp. 1-123.

Parkin, "Solid State Metathesis Reaction for Metal Borides, Silicides, Pnictides and Chalcogenides: Ionic or Elemental Pathways", Chemical Society Reviews, 1996, vol. 25, No. 3, pp. 199-207.

PCT International Search Report and Written Opinion, Application No. PCT/US2016/018188, dated May 27, 2016.

* cited by examiner

ID: 10,026,855 B2

PROCESS FOR MAKING POWDER ALLOYS CONTAINING CADMIUM AND SELENIUM

BACKGROUND OF THE INVENTION

The present invention relates to a self-propagating high temperature synthesis (SHS) process for making highly pure powder alloys of cadmium and selenium, optionally ternary or quaternary alloys with other elements, with or without dopants, for use in vapor deposition processes for photovoltaic devices.

During the fabrication of photovoltaic devices, layers of semiconductor material can be applied to a substrate with one layer serving as a window layer and a second layer serving as the absorber layer. The window layer allows the penetration of solar radiation to the absorber layer, where the optical power is converted into electrical power. Some photovoltaic devices use transparent thin films that are also conductors of electrical charge. The conductive thin films may include transparent conductive layers that contain a transparent conductive oxide (TCO), such as fluorine-doped tin oxide, aluminum-doped zinc oxide, or indium tin oxide. The TCO can allow light to pass through a semiconductor window layer to the active light absorbing material and also serve as an ohmic contact to transport photogenerated charge carriers away from the light absorbing material. A back electrode can be formed on the back surface of a semiconductor layer. The back electrode can include electrically conductive material, such as metallic silver, nickel, copper, aluminum, titanium, palladium, chrome, molybdenum or any practical combination thereof. Methods for forming such semiconductor layers include vapor deposition and/or sublimation of metal alloys from a power alloy product.

Known prior art processes for making alloy powders include High-pressure Bridgman (HPVB) and vertical zone melting (HPVZM) growth processes, both of which are described in Kolesnikov, et al., Brookhaven National Laboratory Report BNL-69260 (2002), incorporated by reference. For example, the paper describes manufacturing $Cd_{(1-x)}Zn_xTe$ (x=0.04-0.2), CdSe and ZnSe crystal tapes with sizes up to 120×120×12 mm. The influences of the technological parameters describing the growth processes on the crystal quality and some selected material properties are discussed in this paper. However, the HPVB and HPVZM methods require specific high-pressure reactors that are expensive equipment.

It would be advantageous if there could be developed highly pure alloys in powder form for use in vapor deposition or sublimation processes for thin film photovoltaic cells.

BRIEF DESCRIPTION OF THE DRAWINGS

The accompanying drawings, incorporated herein and forming a part of the specification, illustrate the present invention in its several aspects and, together with the description, serve to explain the principles of the invention. In the drawings, the thickness of the lines, layers, and regions may be exaggerated for clarity.

DETAILED DESCRIPTION

Figures 1, 2:
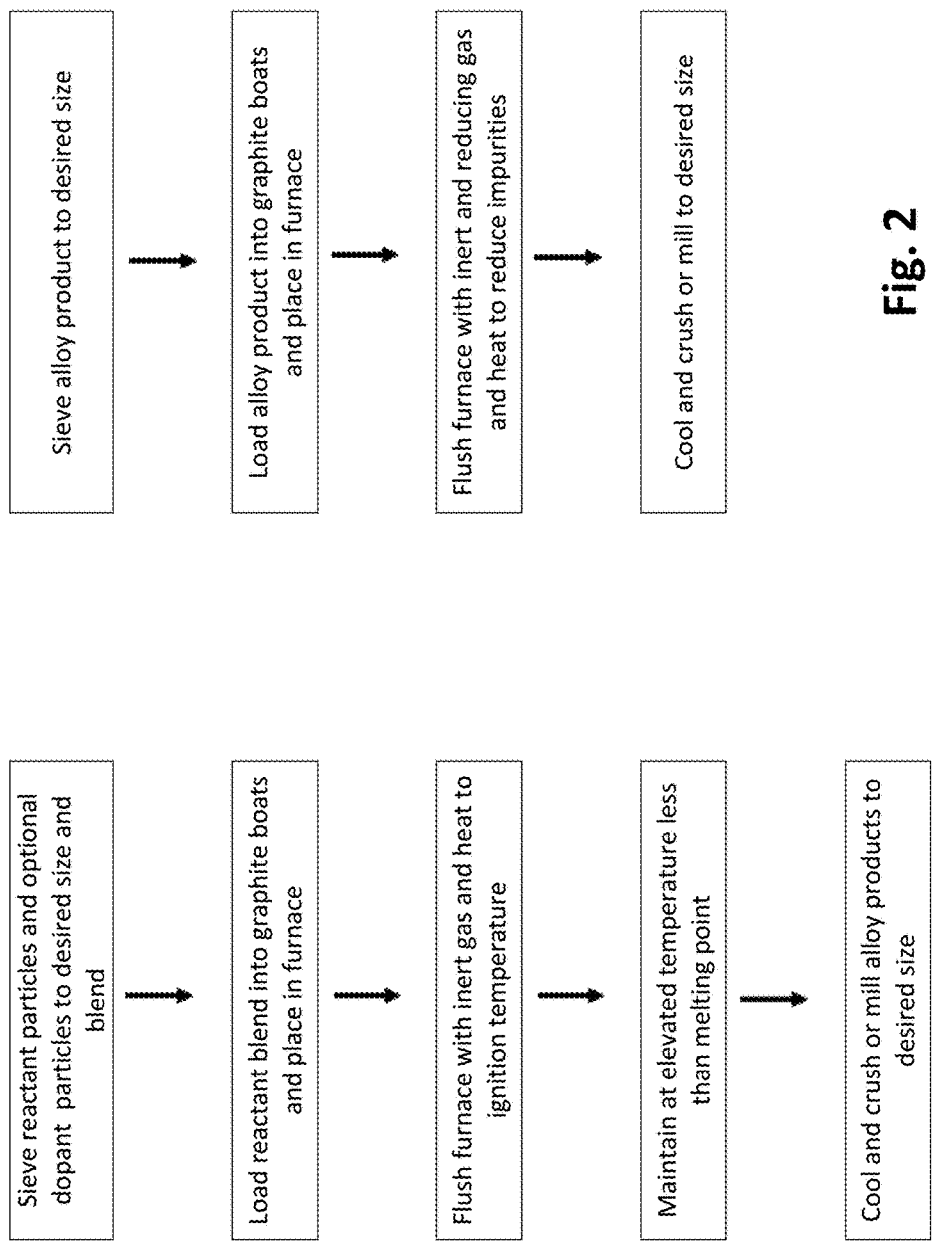
FIG. 1 is a schematic representation of the process according to the invention.
FIG. 2 a schematic representation of an additional, optional purification process.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Unless defined otherwise, all technical and scientific terms used herein have the same meaning as commonly understood by one of ordinary skill in the art to which the invention belongs. Although any methods and materials similar or equivalent to those described herein can be used in the practice or testing of the present invention, the preferred methods and materials are described herein.

Numerical ranges, measurements and parameters used to characterize the invention—for example, angular degrees, quantities of ingredients, polymer molecular weights, reaction conditions (pH, temperatures, charge levels, etc.), physical dimensions and so forth—are necessarily approximations; and, while reported as precisely as possible, they inherently contain imprecision derived from their respective measurements. Consequently, all numbers expressing ranges of magnitudes as used in the specification and claims are to be understood as being modified in all instances by the term "about." All numerical ranges are understood to include all possible incremental sub-ranges within the outer boundaries of the range. Thus, a range of 30 to 90 units discloses, for example, 35 to 50 units, 45 to 85 units, and 40 to 80 units, etc. Unless otherwise defined, percentages are wt/wt %.

The term "transparent" as used herein refers to material that allows an average transmission of at least 70% of incident electromagnetic radiation having a wavelength in a range from about 300 nm to about 850 nm.

In the present disclosure, when a layer is being described as being disposed or positioned "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated. Likewise, a layer that is "disposed on" a different does not necessarily imply that the two layers are in direct contact with one another and may allow for the presence of intervening layers. In contrast, the term "adjacent" is used to imply that two layers are in direct physical contact.

All references cited herein, including books, journal articles, published U.S. or foreign patent applications, issued U.S. or foreign patents, and any other references, are each incorporated by reference in their entireties, including all data, tables, figures, and text presented in the cited references.

Photovoltaic Devices Generally

A photovoltaic device generally includes a transparent conductive layer disposed on a substrate, a first semiconductor layer positioned over the transparent conductive layer, and a second semiconductor layer positioned between the first semiconductor layer and a back metal contact. The two semiconductor layers generally form a heterojunction or are doped to form a heterojunction that produces a current or voltage upon exposure to light. The TCO and back contact are conductors that connect this voltage or current to a load. Usually one of the semiconductor layers is considered the "absorber" layer, and the other may be transparent like a "window" to allow light to pass to the absorber layer. Depending on the configuration, many additional layers may be present, including buffer layers, interfacial layers, high resistance layers, reflective layers, up- or down-converting layers, etc. The following US patents provide some examples of such configuration variances, and the disclosure of each is incorporated by reference: U.S. Pat. No. 8,603,253; U.S. Pat. No. 8,785,232; U.S. Pat. No. 8,748,214; U.S. Pat. No. 8,497,151; U.S. Pat. No. 8,431,427; U.S. Pat. No. 8,741,687; and U.S. Pat. No. 8,525,021.

The multiple layers of a photovoltaic device may be applied by the same or different methods. Methods used may include chemical vapor deposition (CVD), spray pyrolysis, electro-deposition, sputtering, close-space sublimation (CSS), and any other known process useful for forming thin-film semiconductors.

Powder Alloy Compositions

Powder alloys that can be manufactured according to the present invention include at least binary, ternary, and quaternary alloys. Alloys are compositions of two, three, four, or more elements that contain substantially only those elements with only minor impurities. A binary alloy consists essentially of cadmium and selenium. Dopants, although often intentionally included, are in a sense impurities in the alloy. Thus, an alloy "consisting essentially of" elements A and B includes an A-B alloy doped with one or more dopants. Dopants generally do not exceed molar or atomic concentrations of about 10,000 ppm (or 1 wt %), typically only about 1,000 ppm (or 0.1 wt %). Thus, "consisting essentially of" is defined herein to exclude an additional alloying element over 1% of the composition, but not to exclude dopants comprising less than 1%. By convention, dopants are written in empirical formulae in parentheses and are not counted in the atomic percent of the overall alloy formulation. Tables A, B, and C below illustrate.

A ternary alloy consists essentially of cadmium, selenium and a third different element X or Y to form an alloy of the formula $CdSe_uX_{(1-u)}$, or $Cd_wY_{(1-w)}Se$, wherein X is an element selected from group VIA; Y is an element selected from group IIB; u and w are numbers from 0.05 to 0.99. In certain embodiments, u or w is a number from about 0.1 to about 0.8. In certain embodiments, Y is selected from Zn, and Hg; and in certain embodiments X is selected from S and Te. Some representative ternary alloys are set forth in Table A.

TABLE A

Representative ternary alloys

| $CdSe_uX_{(1-u)}$ or $Cd_wY_{(1-w)}Se$ | | note |
|---|---|---|
| CdSeTe | X = Te; u = 0.05 to 0.95 | |
| CdSeTe(Cu) | X = Te; u = 0.05 to 0.95 | copper dopant |
| CdSSe | X = S; u = 0.05 to 0.95 | |
| CdSeTe(Sb) | X = Te; u = 0.05 to 0.95 | antimony dopant |
| CdHgSe | Y = Hg; w = 0.05 to 0.95 | |
| CdZnSe | Y = Zn; w = 0.05 to 0.95 | |

A quaternary alloy consists essentially of cadmium, selenium and third and forth different elements X, X', Y or Y' to form a quaternary alloy of the formula:

$$CdSe_uX_{(v)}X'_{(1-v-u)} \text{ or } Cd_wY_{(z)}Y'_{(1-z-w)}Se \text{ or } Cd_wY_{(1-w)}Se_uX_{(1-u)}$$

in which X and X' are different and independently selected from elements in group VIA; Y and Y' are different and independently selected from elements in group IIB; u and w are independently a number from 0.05 to 0.98; and v and z are independently a number from 0.001 to 0.75. In certain embodiments, u and w are numbers from about 0.1 to 0.9; and in certain embodiments, v and z are numbers from about 0.01 to 0.5. In certain embodiments, Y and Y' are selected from Cd, Zn, and Hg; and in certain embodiments, X and X' are selected from S and Te. Some representative ternary alloys are set forth in Table B.

TABLE B

Representative quaternary alloys

| $CdSe_uX_{(v)}X'_{(1-v-u)}$ or $Cd_wY_{(z)}Y'_{(1-z-w)}Se$ or $Cd_wY_{(1-w)}Se_uX_{(1-u)}$ | | note |
|---|---|---|
| CdSSeTe | X = S, X' = Te; u = 0.05 to 0.95, v = 0.01 to 0.5 | |
| CdSSeTe (Cu) | X = S, X' = Te; u = 0.05 to 0.95, v = 0.01 to 0.5 | copper dopant |
| CdSSeTe (Sb) | X = S, X' = Te; u = 0.05 to 0.95, v = 0.01 to 0.5 | antimony dopant |
| CdZnHgSe | Y = Zn, Y' = Hg; w = 0.05 to 0.95, z = 0.01 to 0.5 | |
| CdZnSeTe | X = Te; Y = Zn; w = 0.05 to 0.95, u = 0.05 to 0.95 | |
| CdZnSSe | X = S; Y = Zn; w = 0.05 to 0.95, u = 0.05 to 0.95 | |
| CdHgSeTe | X = Te; Y = Hg; w = 0.05 to 0.95, u = 0.05 to 0.95 | |
| CdHgSSe | X = S; Y = Hg; w = 0.05 to 0.95, u = 0.05 to 0.95 | |
| CdZnSSe(Cu) | X = S; Y = Zn; w = 0.05 to 0.95, u = 0.05 to 0.95 | copper dopant |
| CdHgSeTe(Sb) | X = Te; Y = Hg; w = 0.05 to 0.95, u = 0.05 to 0.95 | antimony dopant |

Alloy compositions may be doped or undoped. If doped, dopants may be provided as elements from groups IA, IIIA, IVA, VA, VIA, VIIA, IB, and IIB, or as compounds formed from these elements and other elements selected from groups VIA or IIB. Representative dopants may include Na, Li, K, B, Al, Ga, In, Tl, Ge, Sn, Pb, P, As, Sb, F, Cl, Br, I, Cu, Ag, and Au and compounds of these with elements from groups VIA or IIB. For example, dopant particles may consist of Cu alone, $Cu_2Te$, Sb alone, $SbTe_2$, Pb alone, PbTe, As alone, $As_2Te_3$, Cl alone, $CdCl_2$, Ag alone, $Ag_2Te$, etc. It should be understood that elements and compounds from groups VIA and IIB may be either an alloying component (e.g. if used at 1 wt % or more) or a dopant (e.g. if used at 1 wt % or less.)

Reaction Mixtures

In accordance with the invention, at least cadmium particles, selenium particles, and quenchant particles (discussed below) are blended into a reaction mixture that is heated at a controlled rate to an ignition temperature in a SHS process (also discussed below). Third and/or fourth elements may also be included in the reaction mixture in order to form ternary or quaternary alloy products as described above. The cadmium, selenium, and optional third and fourth elements are referred to collectively as the "reactant particles." Reactant particles are generally provided as relatively pure elemental particles, not as compounds of two or more elements.

If dopants are desired, the dopants are provided as "dopant particles" of elemental or compound forms as noted above. The reactant particles and dopant particles should be of a size range that affords good surface area for reaction. Applicants have found that a particle size range from 1 to about 1000 microns is suitable. In some embodiments the reactant particles are less than about 200 microns, for example from about 1 to about 50 microns. Particle size distributions are easily managed by milling or grinding, and sieving through standard mesh sieves until a relatively uniform distribution is obtained. For example, a standard #400 mesh sieve passes particles that are about 37 microns or smaller, whereas a standard #325 mesh sieve passes particles that are about 45 microns or smaller. Larger mesh sizes, if desired, are also well known.

Quenchant particles are also important for controlling the SHS reaction. Quenchant particles are essentially compounds that are the products that are to be made in the SHS reaction. As such, their presence controls the reaction. Quenchant particles may be larger than the reactant particles and dopant particles, for example less than about 500 microns, or from about 10 to about 300 microns. Of course, they do not need to be larger. Quenchant particles are added to the reaction mixture at weight percentages from about 1% to about 70%, or from about 5% to about 60%. Balancing the relative amounts of quenchant particles with reactant (and optional dopant) particles in the reaction mixture helps to control and "quench" the SHS reaction.

Table C, below provides certain illustrative representations of reaction mixtures that include reactants, quenchants (in parentheses) and, in some cases marked by an asterisk, dopants.

TABLE C

Illustrative reactant mixtures and resulting alloy products

| Reaction Mixture with (Quenchant) and dopant* | Alloy Product |
|---|---|
| 0.45Cd + 0.45Se + (0.55 CdSe) | CdSe |
| 0.45Cd + 0.45Se + (0.5 CdSe + 0.05CdS) | $CdS_{.05}Se_{.95}$ |
| 0.6Cd + 0.6Te + (0.15CdSe + 0.25CdTe) | $CdSe_{.15}Te_{.85}$ |
| 0.45Cd + 0.45Se + (0.55 CdSe) + 0.01Cu* | CdSe(0.01Cu) |
| 0.65Cd + 0.5Te + (0.1CdSe + 0.25CdTe) + 0.05Sb*$Te_2$ | $CdSe_{0.1}Te_{.85}$(0.05 Sb) |
| 0.65Cd + 0.55Te + (0.1CdSe + 0.25CdTe) + 0.05Cu*$_2$Te | $CdSe_{0.1}Te_{.85}$(0.1Cu) |
| 0.65Cd + 0.6Te + (0.1CdSe + 0.25CdTe) + 0.05S | $CdSe_{0.1}Te_{.85}S_{.05}$ |

SHS Process

Self-Propagating or Self-Sustaining High-temperature Synthesis (also known as SHS) is a synthetic process at relatively high temperatures and has been used for ceramics and metal alloys. Early work in the area of SHS was started by using mixtures of metals with boron, carbon, and silicon. Since 1976, a large number of universities and laboratories worldwide have been engaged in the research and development of SHS. In SHS the energy input is applied locally to a small but sufficiently large volume of the reactant sample to increase the local temperature to the ignition temperature of the mixture. Thereafter, the reaction does not need further energy input due to its self-sustaining nature. The generated heat passes on to the next portion of unreacted composition and raises its temperature until its ignition is again achieved. The heat and reaction propagate like a wave through the unreacted mixture leaving behind the combustion products.

As is customary in SHS reactions, the reactants are added to refractory vessels before being inserted into a furnace. The vessels may be made of graphite or quartz for example and are sometimes referred to as "boats." The general SHS process is illustrated in FIG. 1.

The rate of heat application is an important factor and is generally carefully controlled. If heat is applied too rapidly, an explosion can result; if applied too slowly, the reaction may not produce the desired result. Applicants have found that applying heat at a rate from about 2° C./min to about 100° C./min is generally adequate. In certain embodiments, applying heat at a rate of at least about 7° C./min is useful for forming a crystalline alloy product, whereas applying heat at a rate of less than about 7° C./min is useful for forming an amorphous alloy product. In certain embodiments, heat is applied at a rate of from about 10° C./min to about 25° C./min.

After the reaction mixture reaches ignition temperature, heat is no longer applied but the temperature is maintained at an elevated temperature by the self sustaining process. This phase of elevated temperature is generally less than the melting point of the alloy product, typically in the range from about 40% to about 85%, or from about 55% to about 75% of the melting point of the alloy product. If any of the reactants or products have high vapor pressures (e.g. S), a somewhat lower temperature may be used to avoid lower yields or non-stoichiometric products caused by vaporization of high vapor pressure compounds. For example, CdSe melts at about 1240° C. so the elevated temperature range for this alloy may range from about 495° C. to about 1055° C. Other alloys melt at different temperatures and the elevated temperature phase is adjusted accordingly. This elevated temperature is maintained for a time period sufficient to allow the alloy to fully react and become more homogeneous. A sufficient time period may be from 1 or 2 minutes up to 2-3 hours, although a range of from 5 minutes to 60 minutes is more typical.

In most embodiments, the elevated temperature is maintained in an inert environment. An inert environment may include argon, nitrogen or other inert gases. The environment may be maintained as an inert and reducing environment in some embodiments. A reducing environment may include hydrogen gas or other reducing gases, such as hydrocarbons, carbon monoxide, carbon dioxide-carbon monoxide mixtures, or mixtures with inert gases.

Once the reactants have reacted and homogenized, the reaction products are cooled. Cooling also may take place in an inert environment, or in an inert and reducing environment in some embodiments. Cooling rate is not particularly critical, and may be accomplished by any number of methods, including but not limited to, slow furnace cooling, ambient air cooling, forced air cooling, and enhanced or chilled forced air cooling.

After cooling, the products are removed from the reaction vessels or boats and may be crushed, ground or milled to any desired size. In some embodiments, the products are jaw crushed and may be sieved for more uniform sizes.

De-Oxidation Process

An optional secondary process may also be used to further purify the alloy products, and is depicted in FIG. 2. As noted above, compounds with high vapor pressures may possibly be vaporized rather than being incorporated into the SHS alloy product. In reality, all compounds have some vapor pressure and are subject to some loss during the process. In addition, some product may not have fully reacted and may exist in the product as unreacted Cd or Se or Te for example. These vaporized and unreacted products may adversely affect the desired stoichiometry of the alloy product. To rectify this, an optional subsequent de-oxidation step may be employed.

The deoxidation step involves placing the reaction product from the SHS process—optionally milled or ground to a desired size such as +200 mesh—into graphite or quartz boats again. The boats or vessels are inserted into an inert environment and heated. Preferably the inert environment is an inert and reducing environment, and they remain there for a period of time sufficient to remove oxygen, unreacted reactants, and impurities, and to re-balance the stoichiometry. Unreacted reactants, oxygen, and other impurities may be eliminated as elemental or molecular species during this process, when the inert environment is nitrogen and the reducing environment could be hydrogen. This deoxidation process may take from about 0.5 hours to about 10 hours. The temperature during the deoxidation process may range from about 200° C. to about 1100° C., or from about 300° C. to about 950° C.

Thereafter, the products may be crushed, milled, or ground to a desired size for use in the manufacture of photovoltaic devices. In this second milling process, sieves may also be used to restrict particle sizes to a more desired and more uniform size distribution. Notably, particles that are too small (known as "fines") and particles that are too large for a desired distribution may potentially be re-used in the SHS process as quenchant particles, thereby reducing waste.

For example, the deoxidized material, which may be in the form of ingot(s), is sequentially reduced in size from about millimeter sized clusters to below 250 μm by sending through an suitable combination of comminution equipment (e.g. jaw crushers, roller mill, ball mill, etc.). Depending on the product size required, the material can be passed through sieves (e.g. 60 and 200 mesh (which correspond to 250 and 74 μm)) to produce the desired particle size distribution.

The foregoing description of the various aspects and embodiments of the present invention has been presented for purposes of illustration and description. It is not intended to be exhaustive of all embodiments or to limit the invention to the specific aspects disclosed. Obvious modifications or variations are possible in light of the above teachings and such modifications and variations may well fall within the scope of the invention as determined by the appended claims when interpreted in accordance with the breadth to which they are fairly, legally and equitably entitled.

What is claimed is:

1. A process for making powder alloys containing cadmium and selenium, comprising
   blending a mixture of cadmium particles and selenium particles, the cadmium and selenium particles having a size ranging from about 1 to about 600 microns;
   blending into the mixture a quantity of quenchant particles having a size ranging from about 1 to about 1000 microns;
   heating the mixture to an ignition temperature at a rate allowing the reaction to establish a self-propagation mode to form an alloy product;
   maintaining an inert environment at an elevated temperature less than a melting point of the alloy product for a time sufficient to ensure homogenization of the alloy product; and
   cooling and crushing the alloy product to form a homogeneous alloy powder.

2. The process according to claim 1, further comprising blending particles of an additional element into the mixture to form a ternary alloy of the formula $CdSe_uX_{(1-u)}$, or $Cd_wY_{(1-w)}Se$, in which X is an element selected from group VIA; Y is an element selected from group IIB; u and w are numbers from 0.05 to 0.99.

3. The process according to claim 2, wherein Y is selected from Cd, Zn, and Hg and wherein X is selected from S and Te.

4. The process according to claim 1, further comprising blending particles of two additional elements into the mixture to form a quaternary alloy of the formula:

$$CdSe_uX_{(v)}X'_{(1-v-u)} \text{ or } Cd_wY_{(z)}Y'_{(1-z-w)}Se \text{ or } Cd_wY_{(1-w)}Se_uX_{(1-u)}$$

in which X and X' are independently selected from elements in group VIA; Y and Y' are independently selected from elements in group IIB; u and w are independently a number from 0.05 to 0.98; and v and z are independently a number from 0.001 to 0.75.

5. The process according to claim 4, wherein Y is selected from Cd, Zn, and Hg and wherein X is selected from S and Te.

6. The process according to claim 1, wherein the quenchant particles are binary compounds selected from CdSe particles and CdTe particles.

7. The process according to claim 1, wherein the quenchant particles are ternary compounds selected from CdSeTe, CdSeS, CdTeS, ZnSeTe, ZnSeS, ZnTeS, ZnCdSe, ZnCdS, and ZnCdTe particles.

8. The process according to claim 1, wherein the quenchant particles are blended into the mixture in a weight percentage from about 0.1% to about 60%.

9. The process according to claim 1, wherein the particle size of the quenchant particles is from about 10 to about 300 microns.

10. The process according to claim 1, further comprising blending dopant particles into the mixture to form a doped alloy, the dopant particles comprising one or more elements selected from those in groups IA, IIIA, IVA, VA, VIA, VIIA, IB and IIB, and compounds thereof.

11. The process according to claim 10, wherein the dopant particle is blended into the mixture at a concentration from about 0.1 ppm to about 10,000 ppm.

12. The process according to claim 1, wherein the particle size of the cadmium particles and the selenium particles is less than about 200 microns.

13. The process according to claim 1, wherein maintaining an inert environment includes maintaining a reducing inert environment.

14. The process according to claim 1, wherein maintaining an inert environment is at an elevated temperature in the range from about 40% to about 85% of the melting point of the alloy product.

15. The process according to claim 1, further comprising cooling the alloy product in an inert, reducing environment.

16. The process according to claim 1, further comprising subjecting the alloy powder to a deoxidation step comprising heating the alloy powder in a reducing atmosphere.

17. The process according to claim 16, wherein the deoxidation step removes oxygen or unreacted elements or both.

18. The process according to claim 1, further comprising adding heat to the mixture at a rate from about 2° C./min to about 100° C./min.

19. The process according to claim 18, further comprising adding heat to the mixture at a rate from about 10° C./min to about 25° C./min.

20. The process according to claim 1, wherein the ignition temperature is between about 100° C. and about 450° C.

21. The process according to claim 1, wherein the quenchant particles comprise a product of a reaction between cadmium and selenium.

* * * * *